US012766807B2

(12) United States Patent
Yang et al.

(10) Patent No.: US 12,766,807 B2
(45) Date of Patent: Oct. 20, 2026

(54) FLEXIBLE COVER PLATE, DISPLAY MODULE, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yang Yang, Beijing (CN); Wanxu Gao, Beijing (CN); Yangjie Wan, Beijing (CN); Xin Zhang, Beijing (CN); Chuandong Liao, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 255 days.

(21) Appl. No.: 18/691,102

(22) PCT Filed: Jun. 19, 2023

(86) PCT No.: PCT/CN2023/101139
§ 371 (c)(1),
(2) Date: Mar. 12, 2024

(87) PCT Pub. No.: WO2023/246713
PCT Pub. Date: Dec. 28, 2023

(65) Prior Publication Data

US 2024/0399701 A1 Dec. 5, 2024

(30) Foreign Application Priority Data

Jun. 21, 2022 (CN) ......................... 202210706338.3

(51) Int. Cl.
*G06F 1/16* (2006.01)
*B32B 3/30* (2006.01)
(Continued)

(52) U.S. Cl.
CPC .................. *B32B 3/30* (2013.01); *B32B 7/02* (2013.01); *B32B 7/12* (2013.01); *H05K 5/03* (2013.01);
(Continued)

(58) Field of Classification Search
CPC .... B32B 3/30; B32B 7/02; B32B 7/12; H05K 5/03
(Continued)

(56) References Cited

U.S. PATENT DOCUMENTS

2017/0062742 A1 3/2017 Kim
2020/0272204 A1 * 8/2020 Su .............................. C09J 7/00
(Continued)

FOREIGN PATENT DOCUMENTS

CN 108877529 A 11/2018
CN 110047393 A 7/2019
(Continued)

OTHER PUBLICATIONS

Machine_English_translation_CN_110648593_A; Li et. al.; Cover Plate and Display Device; Jan. 3, 2020; EPO; whole document (Year: 2026).*

*Primary Examiner* — Tahseen Khan
(74) *Attorney, Agent, or Firm* — WHDA, LLP

(57) ABSTRACT

A flexible cover plate, a display module and a display apparatus are provided. The at least one layer of cover plate structure includes: a first cover plate layer (101); and a second cover plate layer (102), wherein the second cover plate layer (102) is located on at least one surface of the first cover plate layer (101); and the second cover plate layer (102) is directly attached to the first cover plate layer (101), and an elastic modulus of the second cover plate layer (102) and an elastic modulus of the first cover plate layer (101) are substantially same. While impact resistance and surface
(Continued)

hardness of the flexible cover plate is improved, folding performance of the flexible cover plate is also ensured.

18 Claims, 8 Drawing Sheets

(51) Int. Cl.

| | |
|---|---|
| ***B32B 7/02*** | (2019.01) |
| ***B32B 7/12*** | (2006.01) |
| ***C09J 7/00*** | (2018.01) |
| ***G09F 9/30*** | (2006.01) |
| ***H05K 5/00*** | (2025.01) |
| ***H05K 5/03*** | (2006.01) |
| ***H05K 5/06*** | (2006.01) |

(52) U.S. Cl.
CPC ... *B32B 2307/54* (2013.01); *B32B 2307/7376* (2023.05); *B32B 2457/20* (2013.01)

(58) Field of Classification Search
USPC .......................................................... 428/156
See application file for complete search history.

(56) References Cited

U.S. PATENT DOCUMENTS

| | | | | |
|---|---|---|---|---|
| 2021/0217975 | A1* | 7/2021 | Gu | G09F 9/30 |
| 2021/0407341 | A1* | 12/2021 | Shi | B32B 27/08 |
| 2022/0007530 | A1 | 1/2022 | He | |

FOREIGN PATENT DOCUMENTS

| | | | | | |
|---|---|---|---|---|---|
| CN | 110648593 | A | * | 1/2020 | G09F 9/301 |
| CN | 109494237 | B | | 6/2021 | |
| CN | 113990206 | A | | 1/2022 | |
| CN | 114141149 | A | | 3/2022 | |
| CN | 215955323 | U | | 3/2022 | |
| CN | 114999327 | A | | 9/2022 | |

* cited by examiner

FLEXIBLE COVER PLATE, DISPLAY MODULE, AND DISPLAY DEVICE

CROSS-REFERENCES TO RELATED APPLICATIONS

The present disclosure claims the priority of the Chinese patent application filed on Jun. 21, 2022 before the China National Intellectual Property Administration with the application number of 202210706338.3 and the title of "FLEXIBLE COVER PLATE, DISPLAY MODULE, AND DISPLAY DEVICE", which is incorporated herein in its entirety by reference.

TECHNICAL FIELD

Embodiments of the present disclosure relate to the technical field of display devices and, more particularly, to a flexible cover plate, a display module and a display apparatus.

BACKGROUND

In recent years, folding products have been used more and more widely, and there is a great research prospect around their bending shape, bending radius and impact resistance improvement.

At present, the folding products often adopt combination of flexible folding cover plates made of transparent polyimide (CPI), polyethylene terephthalate (PET), ultra-thin glass (UTG) or the like to achieve foldability, and a design of thinner flexible cover plates is often not conducive to the improvement of impact resistance of products. In the industry, in order to ensure excellent folding performance of products, such as smaller folding radius and longer folding life, mechanical properties of products are often ignored. Therefore, as compared with bar phones, mechanical properties of the folding products, especially falling-ball and pen-impacted performance, are not good.

SUMMARY

A flexible cover plate, a display module and a display apparatus are provided by the embodiments of the present disclosure, which aim at improving impact resistance and surface hardness of the flexible cover plate, while folding performance of the flexible cover plate is ensured.

In a first aspect of the embodiment of the present disclosure, a flexible cover plate is provided, the flexible cover plate includes at least one layer of cover plate structure, wherein the at least one layer of cover plate structure includes:

a first cover plate layer; and a second cover plate layer, wherein the second cover plate layer is located on at least one surface of the first cover plate layer;

wherein the second cover plate layer is directly attached to the first cover plate layer, and an elastic modulus of the second cover plate layer and an elastic modulus of the first cover plate layer are substantially same.

Optionally, the first cover plate layer includes a first surface and a second surface opposite to each other; and the second cover plate layer is located on one of the first surface and the second surface.

Optionally, the flexible cover plate includes a bending area and a non-bending area disposed at at least one side of the bending area;

wherein a thickness of the second cover plate layer in the bending area is less than or equal to the thickness of the second cover plate layer in the non-bending area.

Optionally, an orthographic projection of the second cover plate layer on the first cover plate layer does not overlap with the bending area.

Optionally, the bending area includes two first side edges and a center line located between the two first side edges, the two first side edges are symmetrically arranged at both sides of the center line; and the non-bending area is connected to each of the two first side edges;

wherein in the bending area, the thickness of the second cover plate layer at each of the two first side edges is greater than the thickness of the second cover plate layer at the center line.

Optionally, the second cover plate layer includes a plurality of sub-areas between each of the two first side edges and the center line, thicknesses of the second cover plate layer in different sub-areas are different, and the thickness of the second cover plate layer in a sub-area closer to the center line is smaller;

wherein the thickness of the second cover plate layer in a same sub-area is equal.

Optionally, the thickness of the second cover plate layer decreases from each of the two first side edges to the center line in sequence.

Optionally, when the thickness of the second cover plate layer in the bending area is less than the thickness of the second cover plate layer in the non-bending area, the second cover plate layer includes a concaved area in the bending area, and the flexible cover plate further includes:

a filling layer, wherein the filling layer is located at a side of the second cover plate layer away from the first cover plate layer and the filling layer fills the concaved area.

Optionally, the second cover plate layer includes a third cover plate layer located on the first surface of the first cover plate layer and a fourth cover plate layer located on the second surface of the first cover plate layer;

wherein a thickness of the third cover plate layer in the bending area is equal to the thickness of the third cover plate layer in the non-bending area; and a thickness of the fourth cover plate layer in the bending area is less than the thickness of the fourth cover plate layer in the non-bending area.

Optionally, a thickness of the second cover plate layer is greater than or equal to 5 μm and less than or equal to 300 μm.

Optionally, a material of the first cover plate layer includes at least one of polyethylene terephthalate (PET), transparent polyimide (CPI) and ultra-thin glass (UTG).

Optionally, the elastic modulus of the second cover plate layer is greater than or equal to 1 GPa and less than or equal to 100 GPa.

Optionally, a material of the second cover plate layer is a hot melt adhesive.

Optionally, the at least one layer of cover plate structure includes a first cover plate structure and a second cover plate structure arranged in layer configuration;

wherein a connecting adhesive layer is disposed between the first cover plate structure and the second cover plate structure.

In a second aspect of the embodiment of the present disclosure, a display module is provided, which includes a supporting layer, a display panel disposed on the supporting layer, and the flexible cover plate disposed on the display panel as provided in the first aspect of the embodiment of the present disclosure.

Optionally, the display module includes a bending area and a non-bending area disposed at at least one side of the bending area; and an etching groove is disposed at a side of the supporting layer close to the display panel, and an orthographic projection of the etching groove on the flexible cover plate is located within the bending area; and a packing layer is disposed between the supporting layer and the display panel, and the packing layer at least partially fills the etching groove.

Optionally, the etching groove is arranged to partially or completely penetrate the supporting layer.

In a third aspect of the embodiment of the present disclosure, a display apparatus is provided, which includes the flexible cover plate as provided in the first aspect of the embodiment of the present disclosure, or the display module as provided in the second aspect of the embodiment of the present disclosure.

Beneficial Effects

The flexible cover plate, the display module and the display apparatus are provided in the present disclosure. By configuring that the at least one layer of cover plate structure includes the first cover plate layer and the second cover plate layer, the second cover plate layer is located on the at least one surface of the first cover plate layer, and the second cover plate layer is directly attached to the first cover plate layer, and at the same time, the second cover plate layer can be bent along with the first cover plate layer, by using the flexible cover plate with a composite structure formed by the first cover plate layer and the second cover plate layer, impact resistance and the surface hardness of the flexible cover plate can be improved, and folding performance of the flexible cover plate can also be ensured at the same time.

BRIEF DESCRIPTION OF THE DRAWINGS

In order to more clearly illustrate the technical solutions of the embodiments of the present disclosure, the figures that are required to be used in the description of the embodiments of the present disclosure will be briefly introduced below. Apparently, the figures that are described below are some embodiments of the present disclosure, and a person skilled in the art can obtain other figures according to these figures without paying creative work.

Description of the reference numbers: 10, cover plate structure; 101, first cover plate layer; 102, second cover plate layer; 1021, third cover plate layer; 1022, fourth cover plate layer; 103, filling layer; 104, first cover plate structure; 105, second cover plate structure; 20, supporting layer; 201, etching groove; 30, display panel; 40, buffer layer; 50, connecting adhesive layer; 60, packing layer; 701, first connection layer; 702, second connection layer; 703, third connection layer; A, bending area; B, non-bending area; and C, concaved area.

DETAILED DESCRIPTION

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In related art, by introducing ultra-thin glass (UTG) into a cover plate structure of a display module, mechanical properties of the display module can be improved. However, a currently adopted scheme is to reduce a thickness of the UTG to realize the bending of the UTG. Therefore, mechanical strength of the display module is still weak by only adopting a UTG scheme and the UTG is thin with a large risk of breakage during use. In addition, a production process of the UTG is complicated and the cost is high.

In view of this, a flexible cover plate, a display module and a display apparatus are provided by the present disclosure. By configuring that the at least one layer of cover plate structure includes the first cover plate layer and the second cover plate layer, the second cover plate layer is located on the at least one surface of the first cover plate layer, and the second cover plate layer is directly attached to the first cover plate layer, and at the same time, the second cover plate layer can be bent along with the first cover plate layer, by using the flexible cover plate with a composite structure formed by the first cover plate layer and the second cover plate layer, impact resistance and the surface hardness of the flexible cover plate can be improved, and folding performance of the flexible cover plate can also be ensured at the same time.

Figure 1:
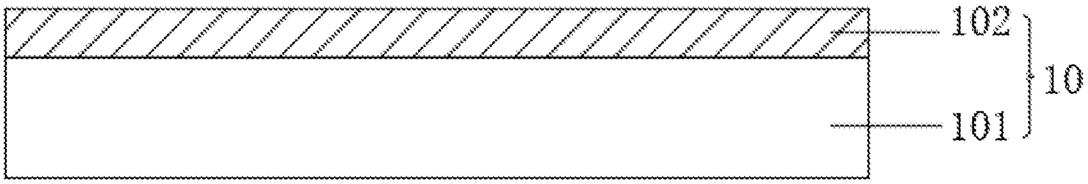
FIG. 1 is a schematic structural diagram of a flexible cover plate according to an embodiment of the present disclosure.

As shown in FIG. 1, a flexible cover plate according to an embodiment of the present disclosure includes at least one layer of cover plate structure 10. Exemplarily, the flexible cover plate may include one layer of cover plate structure 10, two layers of cover plate structures 10, three layers of cover plate structures 10, or the like. Moreover, when the flexible cover plate includes a plurality of layers of cover plate structures 10, the plurality of layers of cover plate structures 10 are arranged in layer configuration, for example, a first layer of cover plate structure is at the top, a second layer of cover plate structure is below the first layer of cover plate structure, and a third layer of cover plate structure is below the second layer of cover plate structure.

Figure 2:
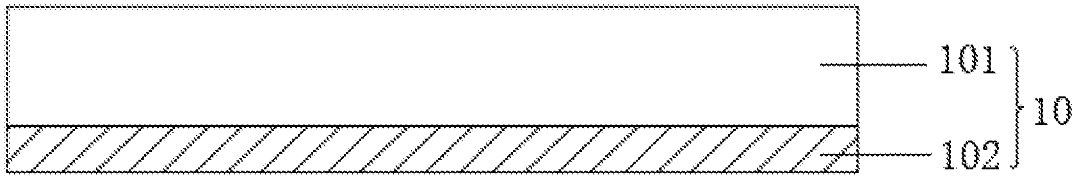
FIG. 2 is a schematic structural diagram of a flexible cover plate with a second cover plate layer on another surface of a first cover plate layer according to an embodiment of the present disclosure.
Figure 3:
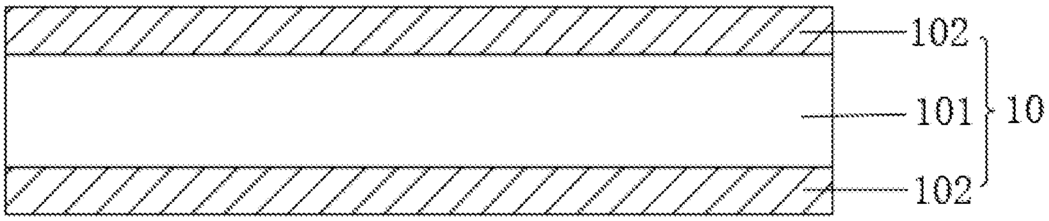
FIG. 3 is a schematic structural diagram of a flexible cover plate with a second cover plate layer on two surfaces of a first cover plate layer according to an embodiment of the present disclosure.

Specifically, as shown in FIGS. 1, 2 and 3, the cover plate structure 10 includes a first cover plate layer 101 and a second cover plate layer 102 disposed on the first cover plate layer 101. The first cover plate layer 101 has two surfaces opposite to each other, and the second cover plate layer 102 is located on at least one surface of the first cover plate layer 101.

Exemplarily, the first cover plate layer 101 includes a first surface and a second surface, and the second cover plate layer 102 may be located on the first surface of the first cover plate layer 101, may also be located on the second surface of the first cover plate layer 101, or the second cover plate layer 102 may also be disposed on both the first surface and the second surface of the first cover plate layer 101.

The first cover plate layer 101 may be of a single-layer structure or may also be of a multi-layer structure. When the first cover plate layer 101 is of the single-layer structure, a material of the first cover plate layer 101 may be CPI (transparent polyimide), PET (polyethylene terephthalate) or UTG. When the first cover plate layer 101 is of the multi-layer structure, materials of each layer of the first cover plate layer 101 can be selected from CPI, PET or UTG, respectively. For example, the first cover plate 101 may be of a composite structure of a layer of CPI material and a layer of PET material, may also be of a composite structure of a layer of PET material and a layer of UTG material, may also be of a composite structure of a layer of CPI material and a layer of UTG material, or may also be of a composite structure of a layer of CPI material, a layer of PET material and a layer of UTG material.

A thickness of the first cover plate layer 101 is greater than or equal to 10 μm and less than or equal to 100 μm. Exemplarily, the thickness of the first cover plate layer 101 can be 10 μm, 15 μm, 20 μm, 25 μm, 30 μm, 50 μm, 100 μm, or the like.

The second cover plate layer 102 is made of a material with certain folding ability and adhesiveness, so that the second cover plate layer 102 can be directly attached to the first cover plate layer 101, and the second cover plate layer 102 can be folded along with the first cover plate layer 101. An expression of "directly attached" means that there is no other layer between the first cover plate layer 101 and the second cover plate layer 102. In this way, after the second cover plate layer 102 and the first cover plate layer 101 are combined, the formed cover plate structure 10 has high toughness and hardness. Exemplarily, the second cover plate layer 102 can be made of a material that is in a molten state at a certain temperature (for example, 100° C.) and in a solidified state at a room temperature (for example, 25° C.). In a manufacturing process, a material of the second cover plate layer 102 is heated to a temperature of 100° C., so that the second cover plate layer 102 can be directly bonded to the first cover plate layer 101 without other connecting materials, thus a manufacturing process of the flexible cover plate is made more simple and convenient. Moreover, at the room temperature, the second cover plate layer 102 can be solidified, thus normal use of the flexible cover plate is not affected.

Moreover, in a solidified state, it is necessary to have certain bonding strength between the second cover plate layer 102 and the first cover plate layer 101, that is, adhesive strength between the second cover plate layer 102 and the first cover plate layer 101. Exemplarily, the bonding strength between the second cover plate layer 102 and the first cover plate layer 101 may be 1 to 30 N/15 mm.

An elastic modulus of the second cover plate layer 102 is greater than or equal to 1 GPa and less than or equal to 100 GPa. Exemplarily, the elastic modulus of the second cover plate layer 102 may be 1 GPa, 10 GPa, 20 GPa, 30 GPa, 40 GPa, 50 GPa, 100 GPa, or the like. Moreover, an elastic modulus of the first cover plate layer 101 is required to be substantially the same as the elastic modulus of the second cover plate layer 102, so that when the cover plate structure 10 is bent, the second cover plate layer 102 can be better bent together with the first cover plate layer 101. In particular, that the elastic modulus of the first cover plate layer 101 is substantially the same as the elastic modulus of the second cover plate layer 102 means that an absolute value of difference between the elastic modulus of the first cover plate layer 101 and the elastic modulus of the second cover plate layer 102 is less than or equal to 10% of the elastic modulus of the first cover plate layer.

In addition, folding resilience of the second cover plate layer 102 after being solidified needs to be maintained at 70% to 100%, so as to satisfy the folding of the flexible cover plate.

It should be noted that the flexible cover plate includes a folded state and an unfolded state. In the unfolded state, the second cover sheet layer 102 is arranged axisymmetrically with respect to the first cover plate layer 101 on the first cover plate layer 101, and any one of the flexible cover plates according to embodiments of the present disclosure meets this arrangement.

For the flexible cover plate according to the embodiment of the present disclosure, after the second cover plate layer 102 and the first cover plate layer 101 are combined, the cover plate structure 10 formed by the second cover plate layer and the first cover plate layer has strong impact resistance and surface hardness, and the folding performance of the cover plate structure 10 can also be ensured.

In an alternative embodiment, a flexible cover plate is provided in an embodiment of the present disclosure, in the flexible cover plate, a material of the second cover plate layer is a hot melt adhesive.

A reason why a hot-melt adhesive is selected for the second cover plate layer 102 is that the material of the hot-melt adhesive has certain folding ability, and the hot-melt adhesive has high rigidity, strong impact resistance and a high elastic modulus after being thermal solidified, and has characteristics of fatigue resistance and low creep. Therefore, after the second cover plate layer 102 made of the material of the hot-melt adhesive is combined with the first cover plate layer 101, the cover plate structure 10 formed by the second cover plate layer and the first cover plate layer has strong impact resistance and surface hardness, and by using the material of the hot-melt adhesive, folding for a small radius such as R0.5 or R1 can also be met, and therefore folding performance of the cover plate structure 10 may not be affected.

Specifically, when the hot melt adhesive is selected as the material of the second cover plate layer 102, curing parameters of the second cover plate layer 102 can be set with a curing temperature of 50° C. to 150° C. and a curing duration of 5 min to 200 min, and the elastic modulus of the second cover plate layer 102 after being solidified is 1 GPa to 70 GPa.

Figure 4:
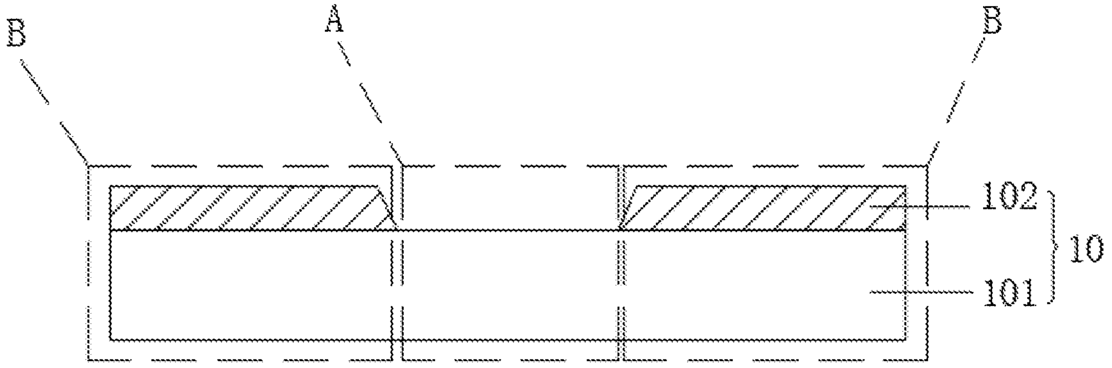
FIG. 4 is a schematic structural diagram of a flexible cover plate without a second cover plate layer being disposed in a bending area according to an embodiment of the present disclosure.

In an alternative embodiment, as shown in FIG. 4, the flexible cover plate includes a bending area A and a non-bending area B disposed at at least one side of the bending area A. A thickness of the second cover plate layer 102 in the bending area A is less than the thickness of the second cover plate layer 102 in the non-bending area B.

Specifically, the thickness of the second cover plate layer 102 may be greater than or equal to 5 μm and less than or equal to 300 μm. Exemplarily, the thickness of the second cover plate layer 102 can be 5 μm, 10 μm, 15 μm, 20 μm, 25 μm, 50 μm, 100 μm, 150 μm, 200 μm, 250 μm, 300 μm, etc. In specific applications, the thickness of the second cover plate layer 102 can be determined by the skilled in the art as required, which is not specifically limited in embodiments of the present disclosure.

Further, the second cover plate layer 102 can be of an equal-thickness structure or of an unequal-thickness structure on the first cover plate layer 101. That is, as shown in FIG. 1, the thickness of the second cover plate layer 102 in the bending area A may be equal to the thickness of the second cover plate layer 102 in the non-bending area B. At this moment, the second cover plate layer 102 is of the equal-thickness structure on the first cover plate layer 101. Meanwhile, as shown in FIG. 4, the thickness of the second cover plate layer 102 in the bending area A may also be less than the thickness of the second cover plate layer 102 in the non-bending area B, and at this moment, the second cover plate layer 102 is of the unequal-thickness structure on the first cover plate layer 101, and the cover plate structure 10 itself has better folding performance when the second cover plate layer 102 is of the unequal-thickness structure.

Meanwhile, when two surfaces of the first cover plate layer 101 are provided with the second cover plate layer 102, the second cover plate layers 102 on both surfaces of the first cover plate layer 101 may be of the equal-thickness structure, may also be of the unequal-thickness structure, or the second cover plate layer 102 on one surface of the first cover plate layer 101 is of the equal-thickness structure and the second cover plate layer 102 on the other surface of the first cover plate layer 101 is of the unequal-thickness structure.

In the following, a plurality of structures where the thickness of the second cover plate layer 102 in the bending area A is less than the thickness of the second cover plate layer 102 in the non-bending area B are illustrated in embodiments of the present disclosure.

In an alternative embodiment, a flexible cover plate is further provided in the present disclosure. In this flexible cover plate, as shown in FIG. 4, the second cover plate layer 102 is not arranged in the bending area A. At this moment, an orthographic projection of the second cover plate layer 102 on the first cover plate layer 101 does not overlap with the bending area A. That is, on a plane of the first cover plate layer 101, the second cover plate layer 102 is broken in the bending area A. In this case, the thickness of the second cover plate layer 102 in the bending area A is zero, thus it can be understood as that the thickness of the second cover plate layer 102 in the bending area A is less than the thickness of the second cover plate layer 102 in the non-bending area B.

Figure 5:
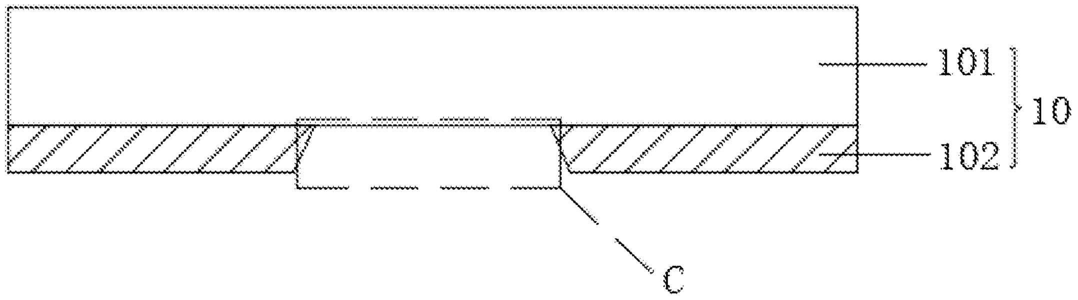
FIG. 5 is a schematic structural diagram of a flexible cover plate with a second cover plate layer on another surface of a first cover plate layer and without a second cover plate layer being disposed in a bending area according to an embodiment of the present disclosure.
Figure 6:
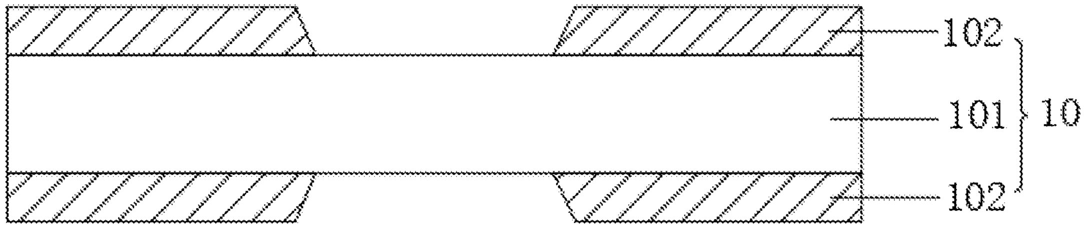
FIG. 6 is a schematic structural diagram of a flexible cover plate with a second cover plate layer on two surfaces of a first cover plate layer and without a second cover plate layer being disposed in a bending area according to an embodiment of the present disclosure.

Further, as shown in FIGS. 5 and 6, when the second cover plate layer 102 is distributed on the other surface of the first cover plate layer 101 or is distributed on the two surfaces of the first cover plate layer 101, the second cover plate layer 102 may not be disposed in the bending area A.

Specifically, in this case, firstly, the second cover plate layer 102 can be made to be a design with a segment difference and protected by using a protective film. When the second cover plate layer 102 is combined with the first cover plate layer 101, it only needs to bond the second cover plate layer 102 to the first cover plate layer 101 by using a bonding fixture and to align a position where the segment difference exists in the second cover plate layer 102 to the bending area A, then the second cover plate layer is solidified, and then combination of the first cover plate layer 101 and the second cover plate layer 102 can be completed.

By using the flexible cover plate according to the embodiment of the present disclosure, the thickness of the second cover plate layer 102 in the bending area A is set to be 0, so that the cover plate structure 10 formed by combining the first cover plate layer 101 with the second cover plate layer 102 has better folding performance; and after the second cover plate layer 102 is combined with the first cover plate layer 101, the impact resistance and surface hardness of the flexible cover plate are improved, folding performance of the flexible cover plate can be also ensured at the same time.

Figure 7:
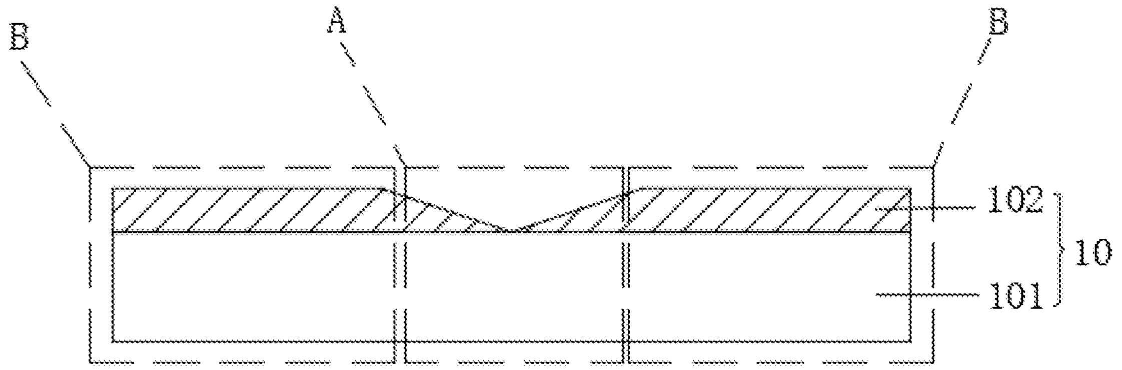
FIG. 7 is a schematic structural diagram of a flexible cover plate with a thickness of a second cover plate layer decreasing in sequence in a bending area according to an embodiment of the present disclosure.

In an alternative embodiment, a flexible cover plate is provided in an embodiment of the present disclosure, in this flexible cover plate, as shown in FIG. 7, the bending area A includes two first side edges (not shown) and a center line (not shown) located between the two first side edges, and the two first side edges are symmetrically arranged at two sides of the center line, and the non-bending area B is connected to each of the two first side edges.

Specifically, in this flexible cover plate, the non-bending areas B are arranged at the two sides of the bending area A, so the two first side edges are connected to the two non-bending areas B, respectively. Therefore, the two first side edges can be understood as a boundary line between the bending area A and the non-bending area B, and the center line can be understood as a center line of the first cover plate layer 101.

Meanwhile, in this flexible cover plate, in the bending area A, the thickness of the second cover plate layer 102 is greater than the thickness of the second cover plate layer 102 close to the center line. That is to say, unlike the flexible cover plate described above, in this flexible cover plate, the thickness of the second cover plate layer 102 in the bending area A is not zero, but the thickness of the second cover plate layer 102 in the bending area A is not the uniform, but decreases from each of the two first side edges to the center line.

Exemplarily, as shown in FIG. 7, the thickness of the second cover plate layer 102 in the bending area A may decrease from each of the two first side edges to the center line in sequence, and at this moment, the thickness of the second cover plate layer 102 in the bending area A gradually varies. The second cover plate layer 102 can be formed on the first cover plate layer 101 by using a mold, and the gradually varying thickness of the second cover plate layer 102 in the bending area A can be realized by using the mold, and then the first cover plate layer 101 can be combined with the second cover plate layer 102 after cooling.

Figure 8:
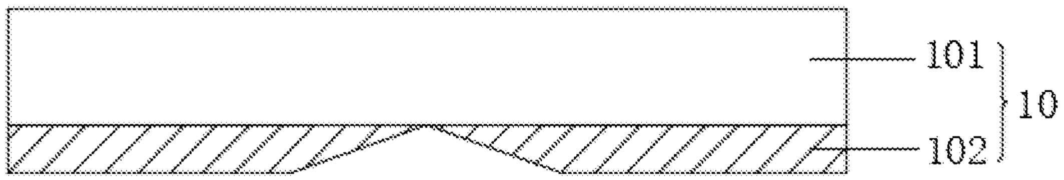
FIG. 8 is a schematic structural diagram of a flexible cover plate with a second cover plate layer on another surface of a first cover plate layer and with a thickness of the second cover plate layer decreasing in sequence in a bending area according to an embodiment of the present disclosure.
Figure 9:
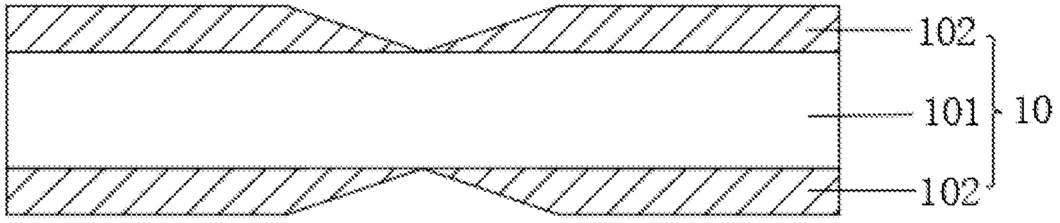
FIG. 9 is a schematic structural diagram of a flexible cover plate with a second cover plate layer on two surfaces of a first cover plate layer and with a thickness of the second cover plate layer decreasing in sequence in a bending area according to an embodiment of the present disclosure.

Further, as shown in FIGS. 8 and 9, when the second cover plate layer 102 is distributed on the other surface of the first cover plate layer 101, or on the two surfaces of the first cover plate layer 101, the thickness of the second cover plate layer 102 in the bending area A can decrease in sequence from each of the two first side edges to the center line.

It should be noted that during the manufacturing process of the cover plate structure 10, there may be glue-overflow areas at the two sides of the second cover plate layer 102, and thus after cooling, the glue-overflow areas need to be removed by using the laser, and then a final cover plate structure 10 can be formed.

Figure 10:
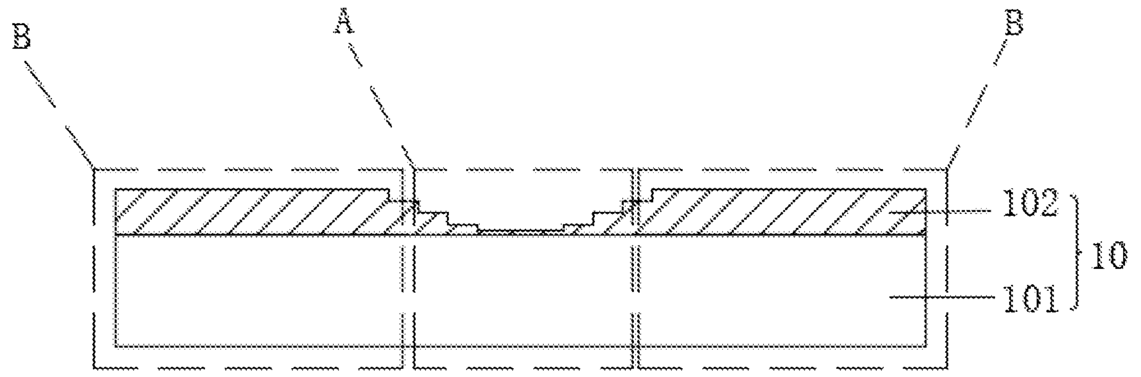
FIG. 10 is a schematic structural diagram of a flexible cover plate with a thickness of the second cover plate layer decreasing in gradient in a bending area according to an embodiment of the present disclosure.

Exemplarily, as shown in FIG. 10, the thickness of the second cover plate layer 102 in the bending area A may not vary gradually. At this moment, the second cover plate layer 102 includes a plurality of sub-areas from each of the two first side edges to the center line, and thicknesses of respective sub-areas are different, and a thickness of a sub-area closer to the center line is smaller, but the thickness of the second cover plate layer 102 located in a same sub-area is equal.

Figure 11:
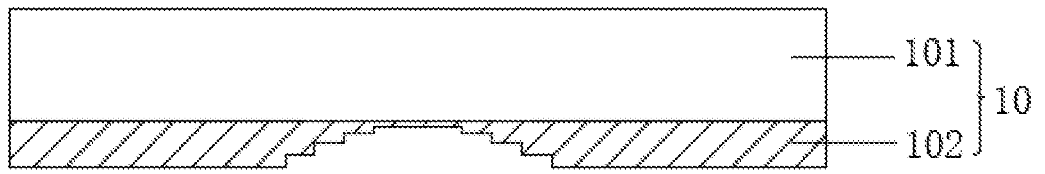
FIG. 11 is a schematic structural diagram of a flexible cover plate with a second cover plate layer on another surface of a first cover plate layer and with a thickness of the second cover plate layer decreasing in gradient in a bending area according to an embodiment of the present disclosure.
Figure 12:
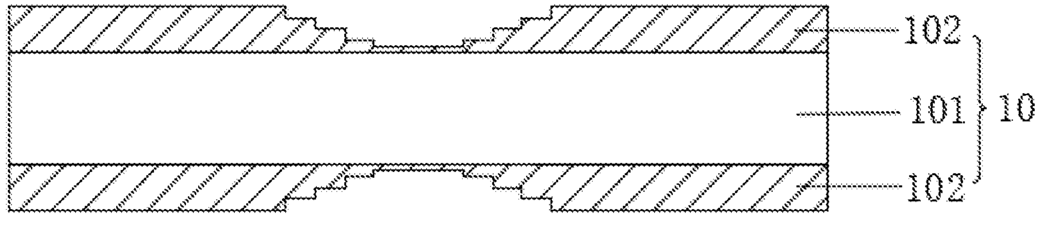
FIG. 12 is a schematic structural diagram of a flexible cover plate with a second cover plate layer on two surfaces of a first cover plate layer and with a thickness of the second cover plate layer decreasing in gradient in a bending area according to an embodiment of the present disclosure.

Further, as shown in FIGS. 11 and 12, when the second cover plate layer 102 is distributed on the other surface of the first cover plate layer 101, or on the two surfaces of the first cover plate layer 101, the thickness of the second cover plate layer 102 in the bending area A may not vary gradually.

For example, the second cover plate layer 102 includes five sub-areas from each of the two first side edges to the center line, wherein a first sub-area is closest to each of the two first side edges and a fifth sub-area is closest to the center line. A thickness of the first sub-area is 100 μm, a thickness of a second sub-area is 90 μm, a thickness of a third sub-area is 80 μm, a thickness of the fourth sub-area is 70 μm, and a thickness of the fifth sub-area is 60 μm. In this way, it is also possible to form a structure where the thickness of the second cover plate layer 102 in the bending area A decreases from each of the two first side edges to the center line.

In the flexible cover plate according to the embodiment of the present disclosure, the thickness of the second cover plate layer 102 in the bending area A decreases from each of the two first side edges to the center line, so that the flexible cover plate has better folding performance, and the second cover plate layer 102 is distributed in the bending area A, and the flexible cover plate also has certain impact resistance and surface hardness in the bending area A, and use effect of the flexible cover plate is further improved.

In an alternative embodiment, a flexible cover plate is further provided in an embodiment of the present disclosure, in the flexible cover plate, the second cover plate layer 102 is located on the first surface and the second surface of the first cover plate layer 101 that are opposite to each other at a same time, a second cover plate layer 102 on the first surface is a third cover plate layer 1021, and a second cover plate layer 102 on the second surface is a fourth cover plate layer 1022.

Figure 13:
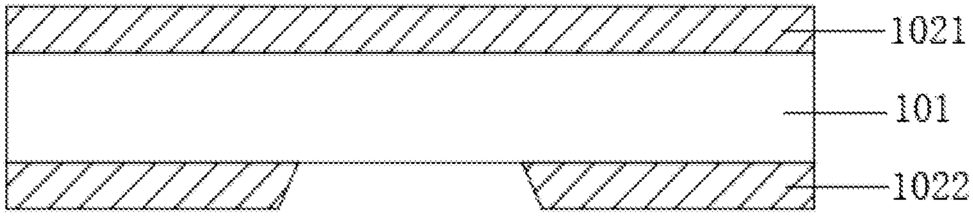
FIG. 13 is a schematic structural diagram of a flexible cover plate with a third cover plate layer of an equal-thickness structure and a fourth cover plate layer of an unequal-thickness structure according to an embodiment of the present disclosure.

Specifically, as shown in FIG. 13, a thickness of the third cover plate layer 1021 in the bending area A is equal to a thickness of the third cover plate layer 1021 in the non-bending area B, and a thickness of the fourth cover plate layer 1022 in the bending area A is less than a thickness of the fourth cover plate layer 1022 in the non-bending area B. That is to say, in this flexible cover plate, the second cover plate layer 102 is disposed on the two surfaces of the first cover plate layer 101, and the third cover plate layer 1021 in the second cover plate layer 102 is of the equal-thickness structure, and the fourth cover plate layer 1022 is of the unequal-thickness structure. The unequal-thickness structure of the fourth cover plate layer 1022 may include any one of unequal-thickness structures described above. For example, the thickness of the fourth cover plate layer 1022 in the bending area A may be zero, or may decrease from each of the two first side edges to the center line, and only a case where the thickness of the fourth cover plate layer 1022 in the bending area A is zero is shown in FIG. 13.

For the flexible cover plate according to the embodiment of the present disclosure, the third cover plate layer 1021 of the equal-thickness structure and the fourth cover plate layer 1022 is of the unequal-thickness structure, so that the folding cover plate has strong impact resistance and surface hardness, and also has strong folding performance.

In an alternative embodiment, a flexible cover plate is further provided in an embodiment of the present disclosure, wherein the flexible cover plate further includes a filling layer 103.

Specifically, as shown in FIG. 5, when the thickness of the second cover plate layer 102 in the bending area A is less than the thickness of the second cover plate layer 102 in the non-bending area B, the second cover plate layer 102 includes a concaved area C in the bending area A, and the filling layer 103 is located at a side of the second cover plate layer 102 away from the first cover plate layer 101, and the filling layer 103 completely fills the concaved area C.

Specifically, when the second cover plate layer 102 has a different structure, a shape of the concaved area C is also different. As shown in FIG. 5, when the second cover plate layer 102 is not disposed in the bending area A, the shape of the concaved area C is trapezoid. As shown in FIG. 7, when the thickness of the second cover plate layer 102 decreases from each of the two first side edges to the center line in sequence, the shape of the concaved area C is triangle. As shown in FIG. 10, when the thickness of the second cover plate layer 102 decreases from each of the two first side edges to the center line in gradient, the shape of the concaved area C is step shape. It should be noted that in FIG. 5, a side edge of the second cover plate layer close to the bending area is disposed as a sloping edge, so the shape of the concaved area C is trapezoid. In other embodiments, the sloping edge may not be disposed at this position, and at this moment, the shape of the concaved area C is rectangle.

Figure 14:
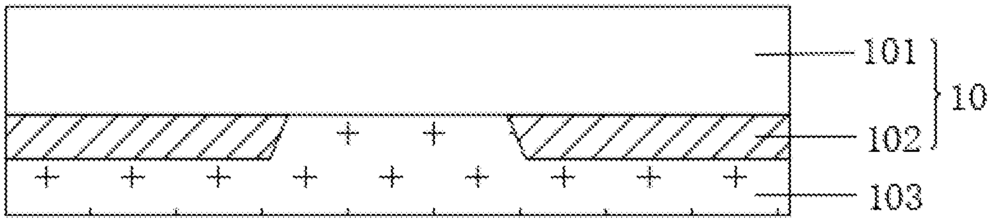
FIG. 14 is a schematic structural diagram of a flexible cover plate provided with a filling layer on the second cover plate layer according to an embodiment of the present disclosure.

When the cover plate structure 10 is connected to other structures (such as another cover plate structure 10 or a display panel 30), a problem of loose connection may easily occur if the second cover plate layer 102 includes the concaved area C. Therefore, in order to make the cover plate structure 10 better connected to other structures, as shown in FIG. 14, a filling layer 103 is disposed at a side of the second cover plate layer 102 away from a back plate. The filling layer 103 can be made of inorganic materials such as $SiO_2$, or organic materials such as acrylic or polyimide.

Figure 15:
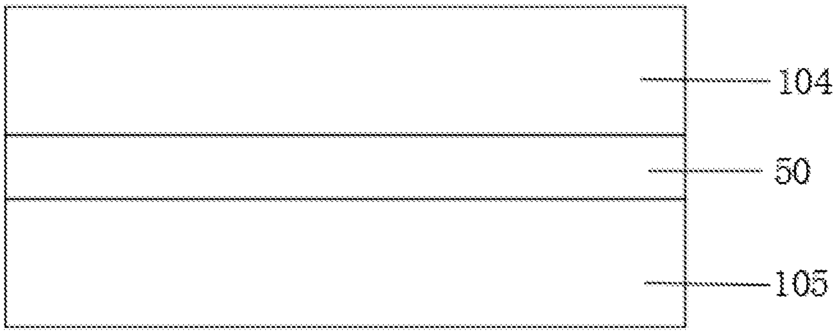
FIG. 15 is a schematic structural diagram of a flexible cover plate including a first cover plate structure and a second cover plate structure according to an embodiment of the present disclosure.

In an alternative embodiment, a flexible cover plate is further provided in an embodiment of the present disclosure, in the flexible cover plate, as shown in FIG. 15, at least one layer of cover plate structure 10 includes a first cover plate structure 104 and a second cover plate structure 105 arranged in layer configuration, and a connecting adhesive layer 50 is disposed between the first cover plate structure 104 and the second cover plate structure 105.

Specifically, the first cover plate structure 104 can be any one of the cover plate structures 10 described above in the embodiments of the present disclosure, and the second cover plate structure 105 can also be any one of the cover plate structures 10 described above in the embodiments of the present disclosure. For better connection between the first cover plate structure 104 and the second cover plate structure 105, the connecting adhesive layer 50 is arranged between the first cover plate structure 104 and the second cover plate structure 105, and OCA (optically clear adhesive) optical adhesive can be selected for the connecting adhesive layer 50, so that the first cover plate structure 104 and the second cover plate structure 105 can be connected more tightly by using the connecting adhesive layer 50. Of course, the connecting adhesive layer 50 may not be disposed between the first cover plate structure 104 and the second cover plate structure 105, and connection between the first cover plate structure 104 and the second cover plate structure 105 may be realized only by the second cover plate layer 102 made of the hot melt adhesive.

Figure 16:
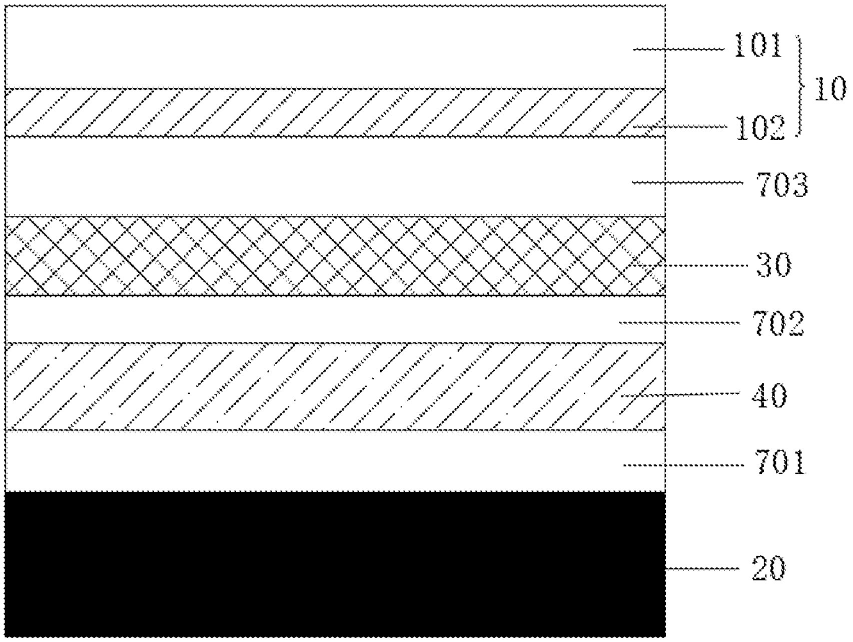
FIG. 16 is a schematic structural diagram of a display module according to an embodiment of the present disclosure.

Based on a same inventive concept, a display module is provided in an embodiment of the present disclosure, and as shown in FIG. 16, the display module includes a supporting layer 20, a display panel 30 disposed on the supporting layer 20, and any one of the flexible cover plates described in the embodiments of the present disclosure disposed on the display panel 30.

Specifically, the supporting layer 20 provides support for the display module, and a material of the supporting layer 20 can be SUS or carbon fiber. A buffer layer 40 can also be disposed between the supporting layer 20 and the display panel 30, and a material of the buffer layer 40 can be foam or PET. The supporting layer 20 and the buffer layer 40 are connected to each other by a first connection layer 701, the buffer layer 40 and the display panel 30 are connected to each other by a second connection layer 702, and the display panel 30 and the cover plate structure 10 are connected to each other by a third connection layer 703. The first connection layer 701, the second connection layer 702 and the third connection layer 703 are all of adhesives, such as OCA optical adhesives.

Figure 17:
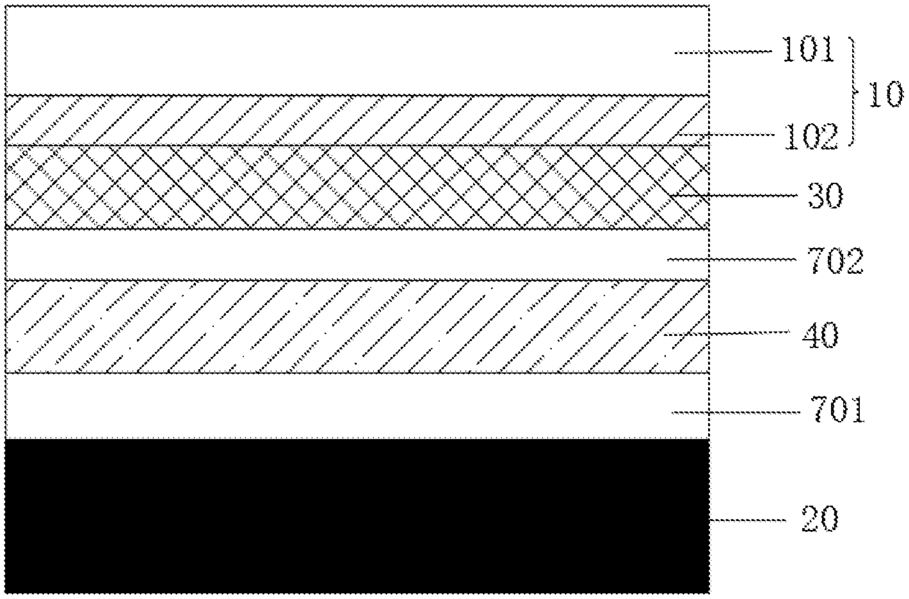
FIG. 17 is a schematic structural diagram of another display module according to an embodiment of the present disclosure.

In addition, as shown in FIG. 17, in an alternative embodiment, the display panel 30 and the flexible cover plate may be directly connected to each other by the adhesive second cover plate layer 102 but not connected to each other by the third connection layer 703.

For the display module according to the embodiment of the present disclosure, the flexible cover plate combined by the second cover plate layer 102 and the first cover plate layer 101 is assembled, so that the display module has stronger impact resistance and surface hardness, and the folding performance of the display module can also be ensured at the same time.

Figure 18:
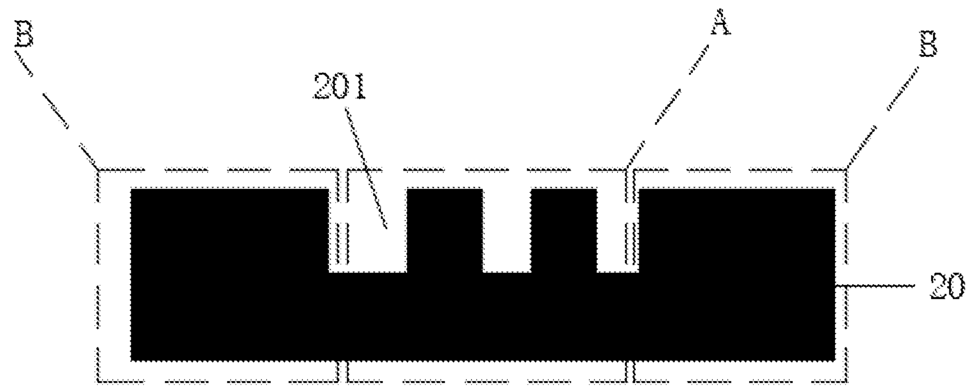
FIG. 18 is a schematic structural diagram of a supporting layer with an etching groove according to an embodiment of the present disclosure.

In an alternative embodiment, a display module is further provided in an embodiment of the present disclosure. As shown in FIG. 18, the display module includes a bending area A and a non-bending area B disposed at at least one side of the bending area A. An etching groove 201 is disposed at a side of the supporting layer 20 close to the display panel 30. An orthographic projection of the etching groove 201 on the flexible cover plate is located within the bending area A, and the etching groove 201 is arranged to partially or completely penetrate the supporting layer 20.

Specifically, a packing layer 60 is disposed between the supporting layer 20 and the display panel 30, and the packing layer 60 at least partially fills the etching groove 201.

Figure 19:
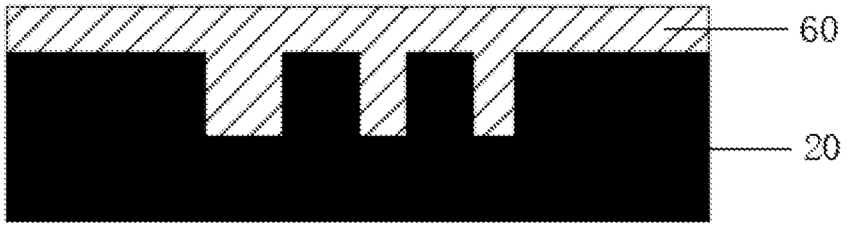
FIG. 19 is a schematic structural diagram of a supporting layer with an etching groove filled with a packing layer according to an embodiment of the present disclosure.
Figure 20:
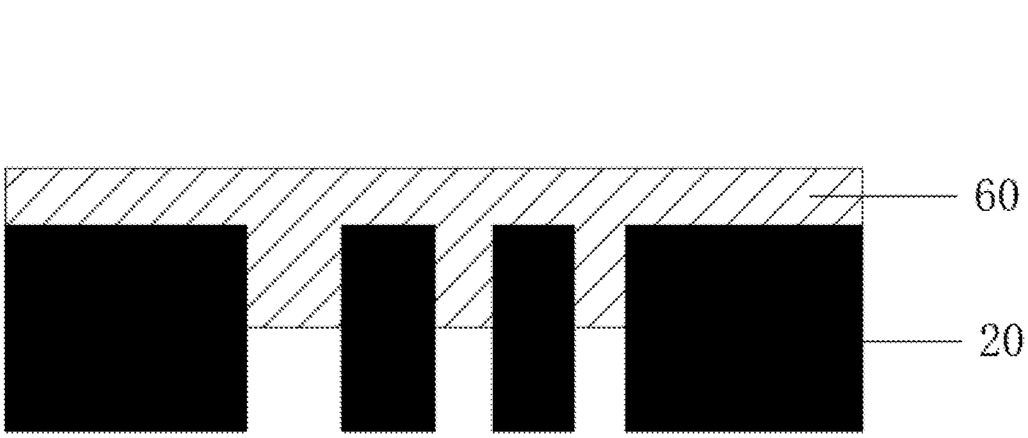
FIG. 20 is a schematic diagram of a structure where a packing layer partially fills an etching groove and the etching groove penetrates a supporting layer according to an embodiment of the present disclosure.
Figure 21:
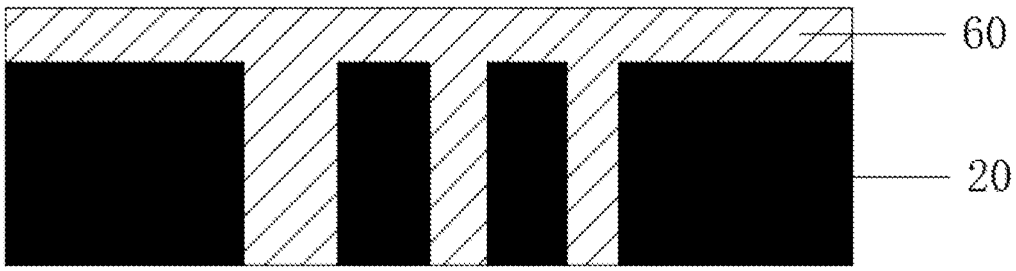
FIG. 21 is a schematic diagram of a structure where a packing layer completely fills an etching groove and the etching groove penetrates a supporting layer according to an embodiment of the present disclosure.

Exemplarily, as shown in FIG. 19, if the etching groove 201 does not completely penetrate the supporting layer 20, the packing layer 60 can completely fill the etching groove 201. As shown in FIG. 20, if the etching groove 201 completely penetrates the supporting layer 20, the packing layer 60 may partially fill the etching groove 201 penetrating the supporting layer 20. As shown in FIG. 21, when the etching groove 201 completely penetrates the supporting layer 20, the packing layer 60 may also completely fill the etching groove 201 penetrating the supporting layer 20, which can be disposed by those skilled in the art according to actual needs.

A material of the packing layer 60 can be a hot melt adhesive. Because the material of the hot melt adhesive has a high elastic modulus, by combining the packing layer 60 of the material of the hot melt adhesive with the supporting layer 20 with the etching groove 201, mechanical properties of the whole display module can be improved, and a fold of the display module can be reduced, so that use effect of the display module is better.

Based on a same inventive concept, a display apparatus is further provided in an embodiment of the present disclosure, the display apparatus includes any one of the flexible cover plates described in the embodiments of the present disclosure or any one of the display modules described in the embodiments of the present disclosure.

Specifically, the display apparatus may include an OLED (organic light-emitting diode 20) display screen, a mobile device such as a mobile phone, a wearable device such as a watch, a VR device, and the like, which can be selected correspondingly by those skilled in the art according to specific use of the display apparatus, and details are not repeated here.

It should be noted that the embodiments of the description are described in the mode of progression, each of the embodiments emphatically describes the differences from the other embodiments, and the same or similar parts of the embodiments may refer to each other.

It should be noted that orientations or position relationships indicated by terms such as "center", "upper", "lower", "left", "right", "vertical", "horizontal", "inner", "outer", etc., herein are based on the orientations or position relationships shown in the drawings. These terms are only to facilitate the description of the present application and simplify the description, rather than indicating or implying that the device or component referred to must have a specific orientation, be constructed and operated in a specific orientation, thus they cannot be understood as a restriction on the present application. Moreover, relational terms such as "first" and "second" are used only to distinguish an entity or operation from another entity or operation, without necessarily requiring or implying that any such actual relationship or order exists between these entities or operations, nor can they be understood as indicating or implying relative importance. Moreover, the term "include", "comprise", or any other variation thereof, is intended to cover non-exclusive inclusion, so that a process, a method, an article, or a terminal device that includes a set of elements includes not only those elements but also other elements that are not explicitly listed or that are inherent to such the process, the method, the article, or the terminal device. In the absence of more restrictions. The limited elements stated by the sentence of "including a . . . " do not rule out that there are other same elements in the process, the method, the article, or the terminal device including the elements.

The technical solution provided in the present application is introduced in detail above, and specific examples have been used herein to explain the principles and embodiments of the present application. The explanation of the embodiments above is only for aiding in understanding the present application, and the content of this specification should not be understood as the limitation to the present application. Meanwhile, for those skilled in the art, there are changes of different forms in specific embodiments and application ranges based on the present application. It is not necessary and not feasible to exhaustively list all embodiments, and obvious variations or modifications thereof are still within the scope of protection of the present application.

The invention claimed is:

1. A flexible cover plate, comprising at least one layer of cover plate structure, wherein the at least one layer of cover plate structure comprises:

a first cover plate layer; and a second cover plate layer, wherein the second cover plate layer is located on at least one surface of the first cover plate layer; and the second cover plate layer is directly attached to the first cover plate layer, and an elastic modulus of the second cover plate layer and an elastic modulus of the first cover plate layer are substantially same;

the first cover plate layer comprises a first surface and a second surface opposite to each other;

the second cover plate layer is located on at least one of the first surface and the second surface;

the flexible cover plate comprises a bending area and a non-bending area disposed at at least one side of the bending area;

the second cover plate layer comprises a third cover plate layer located on the first surface of the first cover plate layer and a fourth cover plate layer located on the second surface of the first cover plate layer;

a thickness of the third cover plate layer in the bending area is equal to the thickness of the third cover plate layer in the non-bending area; and a thickness of the fourth cover plate layer in the bending area is less than the thickness of the fourth cover plate layer in the non-bending area.

2. The flexible cover plate according to claim 1, wherein a thickness of the second cover plate layer in the bending area is less than or equal to the thickness of the second cover plate layer in the non-bending area.

3. The flexible cover plate according to claim 2, wherein an orthographic projection of the second cover plate layer on the first cover plate layer does not overlap with the bending area.

4. The flexible cover plate according to claim 2, wherein the bending area comprises two first side edges and a center line located between the two first side edges, the two first side edges are symmetrically arranged at both sides of the center line; and the non-bending area is connected to each of the two first side edges;

wherein in the bending area, the thickness of the second cover plate layer at each of the two first side edges is greater than the thickness of the second cover plate layer at the center line.

5. The flexible cover plate according to claim 4, wherein the second cover plate layer comprises a plurality of sub-areas between each of the two first side edges and the center line, thicknesses of the second cover plate layer in different sub-areas are different, and the thickness of the second cover plate layer in a sub-area closer to the center line is smaller;

wherein the thickness of the second cover plate layer in a same sub-area is equal.

6. The flexible cover plate according to claim 4, wherein the thickness of the second cover plate layer decreases from each of the two first side edges to the center line in sequence.

7. The flexible cover plate according to claim 2, wherein when the thickness of the second cover plate layer in the bending area is less than the thickness of the second cover plate layer in the non-bending area, the second cover plate layer comprises a concaved area in the bending area, and the flexible cover plate further comprises:

a filling layer, wherein the filling layer is located at a side of the second cover plate layer away from the first cover plate layer and the filling layer fills the concaved area.

8. The flexible cover plate according to claim 1, wherein a thickness of the second cover plate layer is greater than or equal to 5 μm and less than or equal to 300 μm.

9. The flexible cover plate according to claim 1, wherein a material of the first cover plate layer comprises at least one of polyethylene terephthalate (PET), transparent polyimide (CPI) and ultra-thin glass (UTG).

10. The flexible cover plate according to claim 1, wherein the elastic modulus of the second cover plate layer is greater than or equal to 1 GPa and less than or equal to 100 GPa.

11. The flexible cover plate according to claim 1, wherein a material of the second cover plate layer is a hot melt adhesive.

12. The flexible cover plate according to claim 11, wherein the at least one layer of cover plate structure comprises a first cover plate structure and a second cover plate structure arranged in layer configuration;

wherein a connecting adhesive layer is disposed between the first cover plate structure and the second cover plate structure.

13. A display module, comprising:

a supporting layer;

a display panel disposed on the supporting layer; and the flexible cover plate according to claim 1 disposed on the display panel.

14. The display module according to claim 13, wherein an etching groove is disposed at a side of the supporting layer close to the display panel, and an orthographic projection of the etching groove on the flexible cover plate is located within the bending area; and a packing layer is disposed between the supporting layer and the display panel, and the packing layer at least partially fills the etching groove.

15. The display module according to claim 14, wherein the etching groove is arranged to partially or completely penetrate the supporting layer.

16. A display apparatus, comprising:

the flexible cover plate according to claim 1.

17. A display apparatus, comprising:

the display module according to claim 13.

18. The flexible cover plate according to claim 3, wherein when the thickness of the second cover plate layer in the bending area is less than the thickness of the second cover plate layer in the non-bending area, the second cover plate layer comprises a concaved area in the bending area, and the flexible cover plate further comprises:

a filling layer, wherein the filling layer is located at a side of the second cover plate layer away from the first cover plate layer and the filling layer fills the concaved area.

* * * * *